United States Patent
Seki et al.

(10) Patent No.: US 7,093,744 B2
(45) Date of Patent: Aug. 22, 2006

(54) RECOGNITION DEVICE, BONDING DEVICE, AND METHOD OF MANUFACTURING A CIRCUIT DEVICE

(75) Inventors: Kouji Seki, Gunma (JP); Noriyasu Sakai, Gunma (JP); Toshihiko Higashino, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 138 days.

(21) Appl. No.: 10/770,027

(22) Filed: Feb. 2, 2004

(65) Prior Publication Data

US 2004/0155089 A1  Aug. 12, 2004

Related U.S. Application Data

(62) Division of application No. 10/178,214, filed on Jun. 24, 2002, now Pat. No. 6,729,528.

(30) Foreign Application Priority Data

Jun. 27, 2001   (JP)   .................. P. 2001-195397

(51) Int. Cl.
*B23K 31/02*   (2006.01)
(52) U.S. Cl. .................................... 228/103
(58) Field of Classification Search ............ 228/103, 228/105, 180.5, 218, 219, 4.5, 8, 9
See application file for complete search history.

(56) References Cited

U.S. PATENT DOCUMENTS

| | | | | |
|---|---|---|---|---|
| 6,234,376 | B1* | 5/2001 | Wicen | 228/180.5 |
| 6,715,660 | B1* | 4/2004 | Seki et al. | 228/8 |
| 6,729,528 | B1* | 5/2004 | Seki et al. | 228/8 |
| 6,824,037 | B1* | 11/2004 | Sakai et al. | 228/4.5 |
| 2003/0019906 | A1 | 1/2003 | Sakai et al. | 228/1.1 |
| 2004/0154742 | A1* | 8/2004 | Seki et al. | 228/103 |
| 2004/0155089 | A1 | 8/2004 | Seki et al. | 228/103 |

FOREIGN PATENT DOCUMENTS

JP          63-29535       * 2/1988

* cited by examiner

*Primary Examiner*—Kevin P. Kerns
(74) *Attorney, Agent, or Firm*—Fish & Richardson P.C.

(57) ABSTRACT

The present invention solves a problem that in a wire bonding process, an inert gas used for prevention of oxidation of a substrate gave rise to shimmer due to the temperature difference during bonding, thereby degrading the precision of pattern recognition. With this invention's bonding device 21, shielding lids 31, 32, and 33 are disposed at upper and lower parts of a ring illumination 25 and at a lower part of lens barrel 29. Shimmer 37 of nitrogen gas that blows out from a working hole 24 can thus be prevented from entering inside ring illumination 25, especially by shielding lid 31 at the lower part of ring illumination 25. As a result, the recognition precision of a recognition camera can be improved and the wire bonding precision of the µm order can be improved.

10 Claims, 15 Drawing Sheets

RECOGNITION DEVICE, BONDING DEVICE, AND METHOD OF MANUFACTURING A CIRCUIT DEVICE

CROSS REFERENCE TO RELATED APPLICATIONS

This application is a divisional of U.S. Patent Application entitled "Recognition Device, Bonding Device, and Method of Manufacturing a Circuit Device," filed Jun. 24, 2002, application Ser. No. 10/178,214, now U.S. Pat. No. 6,729,528, which is incorporated herein by reference in its entirety.

BACKGROUND OF THE INVENTION

1. Field of the Invention

This invention concerns a recognition device, a bonding device, and a circuit device manufacturing method, and in particular concerns the improvement of the precision of recognition by a recognition device, the improvement of the precision of bonding by a bonding device, and a circuit device manufacturing method that uses such a recognition device and bonding device.

2. Description of the Related Art

Priorly with semiconductor devices, wire bonding to mounting parts formed on a lead frame was performed according to each mounting part, and as an embodiment therefor, a recognition device and bonding device for such wire bonding is disclosed for example in Japanese Unexamined Patent Publication No. Sho-63-29535.

As shown in FIG. 17, a transistor lead frame 2, to which a chip 10 is attached, is set on a heating block part 1. A bonding arm 3 is disposed above lead frame 2 on heating block 1 and a capillary 4 is disposed at the tip of bonding arm 3. A wire 5 is disposed in this capillary 4 and a torch 6, for forming a ball from wire 5, is disposed near capillary 4.

This thermocompression type bonding device is provided with a wire bonding position recognition part 7 and a bonding head driving part 8 as well as with a local heating device 9, which is set to operate in linkage with the operation of bonding head driving part 8 in the X and Y directions and is for heating the bonding part locally. A laser beam device may for example be used as this local heating device 9.

The operations shall now be described. Bonding head driving part 8 is made to move, as programmed in advance in accordance with information from wire bonding position recognition part 7, to lead frame 2 that has been heated by heating block 1, local heating device 9 is made to operate just during the bonding process to perform ball bonding while compensating for inadequate heat on chip 10, capillary 4 is thereafter moved to the lead frame 2 side, local heating device 9 is made to operate again just during the bonding process to perform stitch bonding while compensating for inadequate heat at the lead frame 2 side, and then torch 6 is made to form a ball part at the tip of a wire 5 that has been cut.

Ball bonding is then performed on the other electrode of chip 10 while making local heating device 9 operate just during bonding to compensate for inadequate heat at chip 10, capillary 4 is thereafter moved to the lead frame side, local heating device 9 is made to operate again just during the bonding process to perform stitch bonding while compensating for inadequate heat at the lead frame side, and then torch 6 is made to form a ball part at the tip of a wire 5 that has been cut. Since bonding is thus performed while compensating for inadequate heat at the bonding part, a high quality wire bond is obtained. A wire bond of even higher quality can be obtained by using ultrasonic waves in combination.

Also though the case of a transistor chip was described with the above-described embodiment, this invention is not limited thereto and the chip may be a diode, IC, etc., and the invention can thus be applied as a wire bonder for any semiconductor device.

In the case where mounting parts are formed on a completely punched lead frame 2 as has been described above, just the mounting parts need to be heated, for example, to approximately 250° C. during wire bonding. That is, since the entirety of lead frame 2 is not constantly in a high temperature state and wire bonding could be performed by partial heating, there are no problems of erroneous recognition, degradation of recognition conditions, etc., with the bonding device and recognition device in the above-described example.

Though details shall be given with the description of an embodiment of the present invention, in the case where a cluster block, having a plurality of mounting parts within a small area, is formed on a conductive foil, lead frame, etc., the conductive foil or lead frame, etc., will be kept at a high temperature state until all of the wire bonding processes for a single cluster block has been completed. There was thus the problem that the conductive foil or lead frame, etc., with the cluster block becomes oxidized due to being placed in the abovementioned high temperature state over a long period of time.

The abovementioned oxidation of the lead frame, etc., may be prevented by placing the lead frame in the high temperature state in a space filled with an inert gas, such as nitrogen gas. However, in order to form this space, an inert-gas-filled space must be formed above the working base on which the lead frame is set and furthermore, a working hole for recognition and wire bonding must be formed above this space. In this case, the inert gas becomes heated to a high temperature within the space and, in the process of escaping to the exterior from the working hole, gives rise to a fluctuation (shimmer) due to the temperature difference with room temperature. This fluctuation invades the recognition region and causes erroneous recognition by the recognition camera, thus leading to lack of precision of recognition of highly integrated, fine, conductive patterns.

SUMMARY OF THE INVENTION

This invention has been made in view of the above-described problems of the prior art and provides a recognition device comprising: a substrate setting base, having a heating function; a cover, which covers a working region from above the abovementioned substrate setting base; a working hole, provided in the upper surface of the abovementioned cover; an illumination, disposed above the abovementioned working hole; and a pattern recognition camera, disposed inside a lens barrel provided above the abovementioned illumination; wherein a transparent shielding lid is provided at least at the lower end of the abovementioned illumination to prevent fluctuation of ascending air current, which is due to an inert gas that is blown inside the abovementioned cover being heated by the abovementioned substrate setting base, from entering into the inner side of the abovementioned illumination.

Preferably with the recognition device of this invention, the abovementioned shielding lid is disposed at the lower end of the abovementioned lens barrel. The entry of the abovementioned fluctuation into the abovementioned lens barrel and the entry of dust, etc., from inside the abovementioned lens barrel into the inner side of the abovementioned illumination can thereby be prevented.

Also preferably with the recognition device of this invention, the abovementioned shielding lid is formed of a transparent film or a transparent substrate.

Furthermore, preferably with the recognition device of this invention, the abovementioned inert gas is made to flow into a space formed by the abovementioned cover and the abovementioned substrate setting base.

Also preferably with the recognition device of this invention, a part of the abovementioned cover is formed as a clamper.

Also preferably with the recognition device of this invention, the abovementioned damper is provided with a blow-in hole for the abovementioned inert gas.

Also preferably with the recognition device of this invention, the abovementioned inert gas is made of nitrogen gas.

Also preferably with the recognition device of this invention, the abovementioned illumination is a ring-shaped illumination provided below the abovementioned lens barrel part.

Also in order to resolve the above-described problems, this invention provides a recognition device comprising: a substrate setting base, having a heating function; a cover, which covers a working region from above the abovementioned substrate setting base; a working hole, provided in the upper surface of the abovementioned cover; an illumination, disposed above the abovementioned working hole; and a pattern recognition camera, disposed inside a lens barrel provided above the abovementioned illumination; wherein a transparent shielding lid is provided at least at one of either the upper end of the abovementioned illumination or any position between the upper end and the lower end of the illumination to prevent fluctuation of ascending air current, which is due to an inert gas that is blown inside the abovementioned cover being heated by the abovementioned substrate setting base, from entering into the inner side of the abovementioned illumination.

Also in order to resolve the above-described problems, this invention provides a bonding device comprising: a substrate setting base, having a heating function; a cover, which covers a working region from above the abovementioned substrate setting base; a working hole, provided in the upper surface of the abovementioned cover; an illumination, disposed above the abovementioned working hole; a capillary, disposed at the side face of the abovementioned illumination; and a pattern recognition camera, disposed inside a lens barrel provided above the abovementioned illumination; wherein a transparent shielding lid is provided at least at the lower end of the abovementioned illumination to prevent fluctuation of ascending air current, which is due to an inert gas that is blown inside the abovementioned cover being heated by the abovementioned substrate setting base, from entering into the inner side of the abovementioned illumination, and after recognition by the abovementioned pattern recognition camera, the abovementioned capillary is moved to above the abovementioned working hole and bonding is performed via the abovementioned working hole.

Preferably with the bonding device of this invention, the abovementioned inert gas is made to flow into a space formed by the abovementioned cover and the abovementioned substrate setting base.

Also preferably with the bonding device of this invention, the abovementioned inert gas is made of nitrogen gas.

Also preferably with the bonding device of this invention, the abovementioned illumination is a ring-shaped illumination provided below the abovementioned lens barrel part.

Also in order to resolve the above-described problems, this invention provides a bonding device comprising: a substrate setting base, having a heating function; a cover, which covers a working region from above the abovementioned substrate setting base; a working hole, provided in the upper surface of the abovementioned cover; an illumination, disposed above the abovementioned working hole; a capillary, disposed at the side face of the abovementioned illumination; and a pattern recognition camera, disposed inside a lens barrel provided above the abovementioned illumination; wherein a transparent shielding lid is provided at least at one of either the upper end of the abovementioned illumination or any position between the upper end and the lower end of the illumination to prevent fluctuation of ascending air current, which is due to an inert gas that is blown inside the abovementioned cover being heated by the abovementioned substrate setting base, from entering into the inner side of the abovementioned illumination, and after recognition by the abovementioned pattern recognition camera, the abovementioned capillary is moved to above the abovementioned working hole and bonding is performed via the abovementioned working hole.

Also in order to resolve the above-described problems, this invention provides a circuit device manufacturing method comprising the steps of: preparing a block substrate, which is provided with a plurality of mounting parts and conductive patterns, wherein leads are integrated within a small area, and with which circuit elements are affixed respectively onto the abovementioned mounting parts; setting the abovementioned block substrate on a substrate setting base until assembly onto all of the abovementioned mounting parts is completed; heating the abovementioned substrate setting base by a heating function while filling the interior of a cover with an inert gas; and preventing the fluctuation of ascending air current, which is due to an inert gas that is blown inside the abovementioned cover being heated by the abovementioned substrate setting base, from entering into the inner side of the abovementioned illumination by the provision of a transparent shielding lid at least at the lower end of the abovementioned illumination, recognizing the abovementioned circuit elements respectively on the abovementioned mounting parts by means of a recognition camera installed inside a lens barrel, and wire bonding the abovementioned circuit elements respectively on the abovementioned mounting parts to the abovementioned conductive patterns.

Also preferably with the circuit device manufacturing method of this invention, the abovementioned shielding lid is formed of a transparent film or a transparent substrate.

Also preferably with the circuit device manufacturing method of this invention, the abovementioned inert gas is made of nitrogen gas.

Also preferably with the circuit device manufacturing method of this invention, each of the abovementioned circuit elements has one or both of a bare semiconductor chip and a chip circuit part affixed thereto.

Also in order to resolve the above-described problems, this invention provides a circuit device manufacturing method comprising the steps of: preparing a block substrate, which is provided with a plurality of mounting parts and conductive patterns, wherein leads are integrated within a small area, and with which circuit elements are affixed respectively onto the abovementioned mounting parts; setting the abovementioned block substrate on a substrate setting base until assembly onto all of the abovementioned mounting parts is completed; heating the abovementioned substrate setting base by a heating function while filling the interior of a cover with an inert gas; and preventing the fluctuation of ascending air current, which is due to an inert gas that is blown inside the abovementioned cover being heated by the abovementioned substrate setting base, from entering into the inner side of the abovementioned illumination by the provision of a transparent shielding lid at least at one of either the upper end of the abovementioned illumination or any position between the upper end and the lower end of the illumination, recognizing the abovementioned circuit elements respectively on the abovementioned mounting parts by means of a recognition camera installed inside a lens barrel, and wire bonding the abovementioned circuit elements respectively on the abovementioned mounting parts to the abovementioned conductive patterns.

This invention's recognition device comprising: a substrate setting base, having a heating function; a cover, which covers a working region from above the abovementioned substrate setting base; a working hole, provided in the upper surface of the abovementioned cover; an illumination, disposed above the abovementioned working hole; and a pattern recognition camera, disposed inside a lens barrel provided above the abovementioned illumination. When an inert gas, which is blown inside the abovementioned cover, is heated by the abovementioned substrate setting base and blows out to the exterior from the abovementioned working hole, fluctuation arises due to the temperature difference with respect to room temperature and this fluctuation stagnates at the inner side and in the surroundings of the abovementioned illumination. However, this invention's recognition device is provided with shielding lids at the upper and lower ends of the abovementioned illumination and the lower end of the abovementioned lens barrel and these shielding lids prevent the abovementioned fluctuation from entering into the inner side of the abovementioned illumination. Since the illumination will thus not become blurry due to the abovementioned fluctuation inside the abovementioned illumination, the recognition precision of the abovementioned pattern recognition camera can be improved.

Also, this invention's bonding device comprising: a substrate setting base, having a heating function; a cover, which covers a working region from above the abovementioned substrate setting base; a working hole, provided in the upper surface of the abovementioned cover; an illumination, disposed above the abovementioned working hole; a capillary, disposed at the side face of the abovementioned illumination; and a pattern recognition camera, disposed inside a lens barrel provided above the abovementioned illumination. Fluctuation arises due to the temperature difference with room temperature when an inert gas, which is blown inside the abovementioned cover, is heated by the abovementioned substrate setting base and blows out to the exterior from the abovementioned working hole. This fluctuation is prevented from entering into the inner side of the abovementioned illumination, especially by a shielding lid provided at the lower end of the abovementioned illumination, and recognition is performed by means of the abovementioned pattern recognition camera. Thereafter, the abovementioned capillary is moved to above the abovementioned working hole and bonding is performed via the abovementioned working hole. By preventing the entry of the abovementioned fluctuation into the inner side of the abovementioned illumination by the abovementioned shielding lid in this process, the abovementioned pattern recognition by the recognition camera can be performed at high precision. A bonding device, which can perform highly precise bonding to the μm order, can thus be realized.

Also with this invention's circuit device manufacturing method, by use of the above-described recognition device and bonding device, since a substrate, comprising a conductive member on which is formed a cluster block wherein a plurality of mounting parts are integrated in a small area, will not become oxidized even if placed under a high temperature over a long period of time in the wire bonding process, a circuit device manufacturing method can be realized by which the anti-moisture property and anti-peeling property at the surfaces of bonding of the substrate and an insulating resin are improved.

DETAILED DESCRIPTION OF THE PREFERRED EMBODIMENTS

With regard to the recognition device, bonding device, and circuit device manufacturing method of this invention, first, a first embodiment shall be described in detail.

First, a recognition device and bonding device of this invention shall be described with reference to FIGS. 1 through 3.

With an embodiment of this invention, the recognition device and bonding device act together and are arranged as a bonding device 21 provided with a single recognition device.

Figure 1:
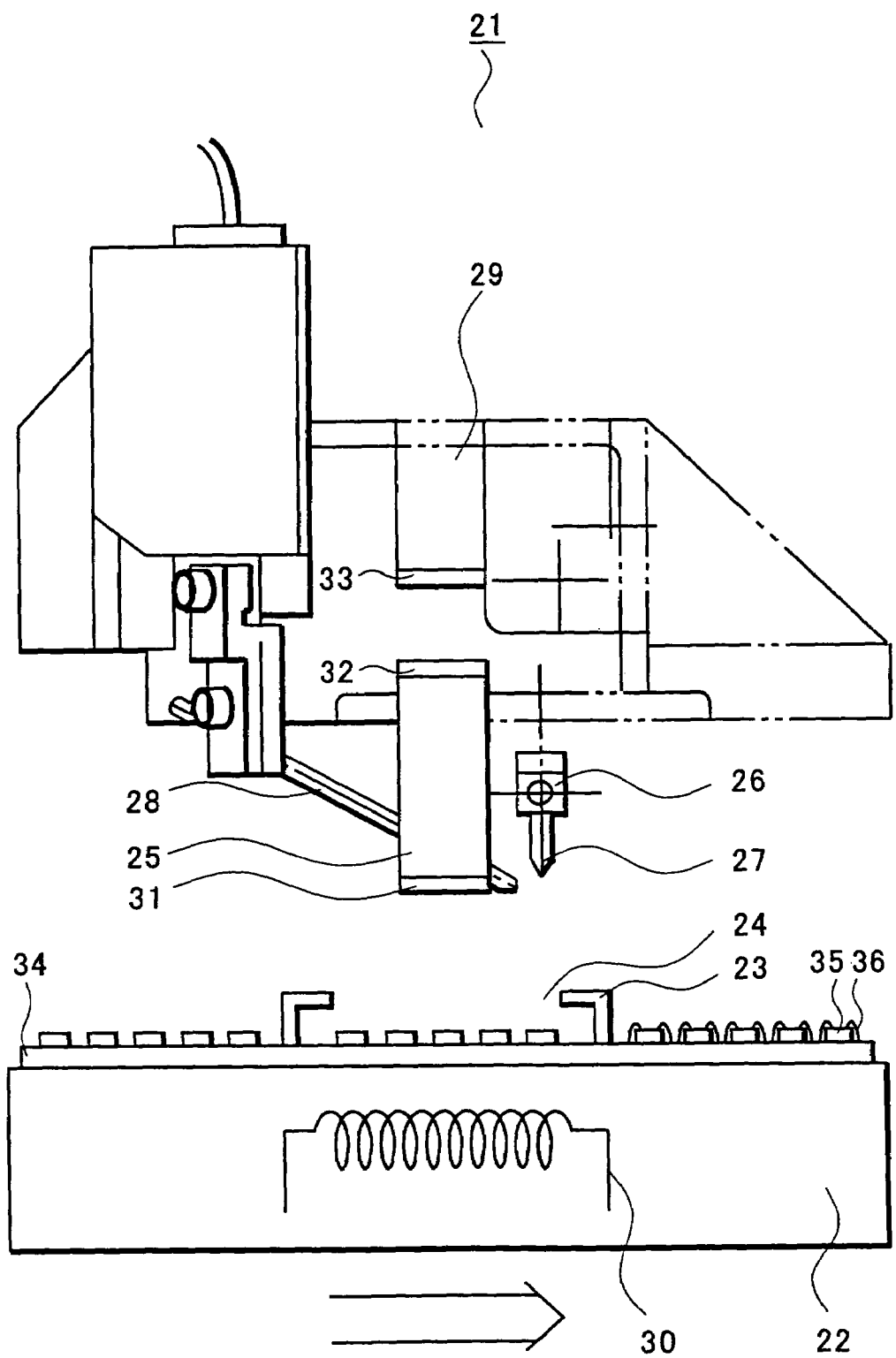
FIG. 1 is a diagram for explaining the bonding device provided with recognition device of the first embodiment of this invention.
Figure 2:
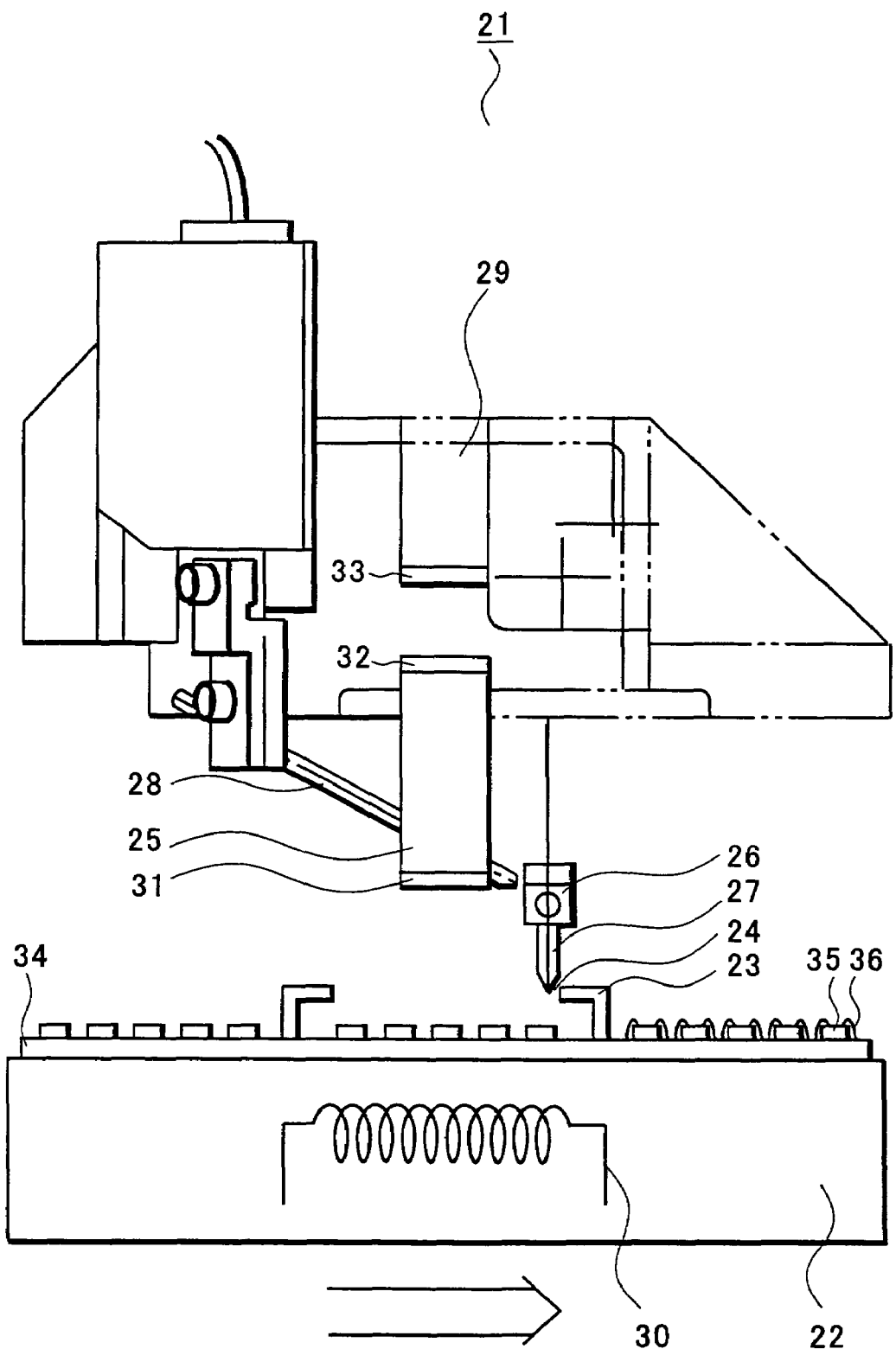
FIG. 2 is a diagram for explaining the bonding device provided with recognition device of the first embodiment of this invention.

As shown in FIG. 1, the main structure of bonding device 21 comprises a setting base 22, a cover 23, which covers a working space from above setting base 22, a working hole 24, which is provided in the upper surface of cover 23, a ring illumination 25, which is disposed above working hole 24, a bonding arm 26, which is disposed at the side face of ring illumination 25, a capillary 27, which is disposed at the tip part of bonding arm 26, a torch 28, which is provided near capillary 27, a lens barrel 29, which is disposed above ring illumination 25, and a recognition camera, which, though not illustrated, is installed inside lens barrel 29.

The characteristics of the individual structures shall now be described along with their operations.

First, on setting base 22 is set a lead frame 34, which has a plurality of mounting parts, and setting base 22 is provided with a heater 30 function for heating lead frame 34 and thereby improving the wire bonding property. By means of this heater 30, the interior of a working space arranged by setting base 22 and cover 23, can be kept at a high temperature state of, for example, approximately 230° C. during the wire bonding process.

Also, though not shown in FIG. 1, a part of cover 23 is formed of a damper 60 (see FIG. 12), and this cover 23 is arranged by putting a lid on the upper face of damper 60 for example by means of a stainless steel plate 67 (see FIG. 12). And, for example, nitrogen gas is blown as an inert gas at a rate of 4 liters/minute into cover 23 from damper 60. This blow-in rate can be varied according to the working application. Working hole 24 is provided in the upper surface of cover 23. Working hole 24 is formed to a size, for example, of 5 mm×32 mm and pattern recognition and wire bonding are performed via this working hole 24 in the wire bonding process.

Here, on lead frame 34, for example 10 rows and 5 columns of mounting parts make up a single cluster block, and a plurality of such cluster blocks are formed. The size of working hole 24 is such that enables, for example, 20 mounting parts of 2 rows of a single cluster block to be recognized from above. As shall be described later, this working hole 24 is used for pattern recognition, etc. The size of this working hole 24 is not defined in particular but is determined according to the working application and based on the recognition pattern method, etc., of bonding device 21.

Ring illumination 25 and lens barrel 29 shall now be described. Lens barrel 29 is disposed above ring illumination 25. Lead frame 34 and semiconductor elements 35, which are illuminated by ring illumination 25 via working hole 24, can be recognized by differences in reflectivity. By recognizing this reflected light by means of the recognition camera disposed inside lens barrel 29, pattern recognition of the upper side of lead frame 34 can be performed. Here, by using ring illumination 25 as the illumination, lead frame and semiconductor elements can be illuminated without bias and without giving rise to shadows, thereby enabling pattern recognition to be performed more precisely. Also, thought not illustrated, lens barrel 29 is bent in the middle at an angle of 90 degrees with respect to the surface of setting base 22 and the recognition camera is installed beyond this bent part. A mirror is installed an angle of 45 degrees with respect to the setting base 22 surface at this bent part, and pattern recognition can be performed by this structure.

With bonding device 21 provided with recognition device that characterizes this invention, shielding lids 31, 32, and 33 are disposed at the upper and lower ends of the above-described ring illumination 25 and the lower end of lens barrel 29. Each of these shielding lids 31, 32, and 33 comprises a transparent film or transparent glass plate etc., and do not obstruct pattern recognition even when disposed at the upper and lower ends of ring illumination 25 and the lower end of lens barrel 29.

The action of shielding lids 31, 32, and 33 is mainly to prevent shimmer 37, which results from the temperature difference with respect to room temperature of the nitrogen gas that flows out from working hole 24, from entering into the inner side of ring illumination 25 and lens barrel 29. Shimmer 37 occurs due to the following work. First, nitrogen gas is for example blown at a rate of 4 liters/minute inside cover 23. At the same time, the interior of cover is kept at a temperature for example of 230° C. by heater 30 built into setting base 22. Though the nitrogen gas that is fed in thereafter is, for example, at 70° C., it is heated to 230° C. by the heat from heater 30.

Though the heated nitrogen gas flows out to the exterior from working hole 24, since the room temperature at this time is, for example, 20° C., shimmer 37, which is substantially that of the nitrogen gas, is caused by the temperature difference between the nitrogen gas and room temperature. As a result, in the case where shielding lids 31, 32, and 33 are not used, shimmer 37 stagnates at the inner side of ring illumination 25 and furthermore fluctuates in the process of passing through the inner side of ring illumination 25, causing the recognition precision of the recognition camera to degrade and the wire bonding precision to fall.

Figure 3:
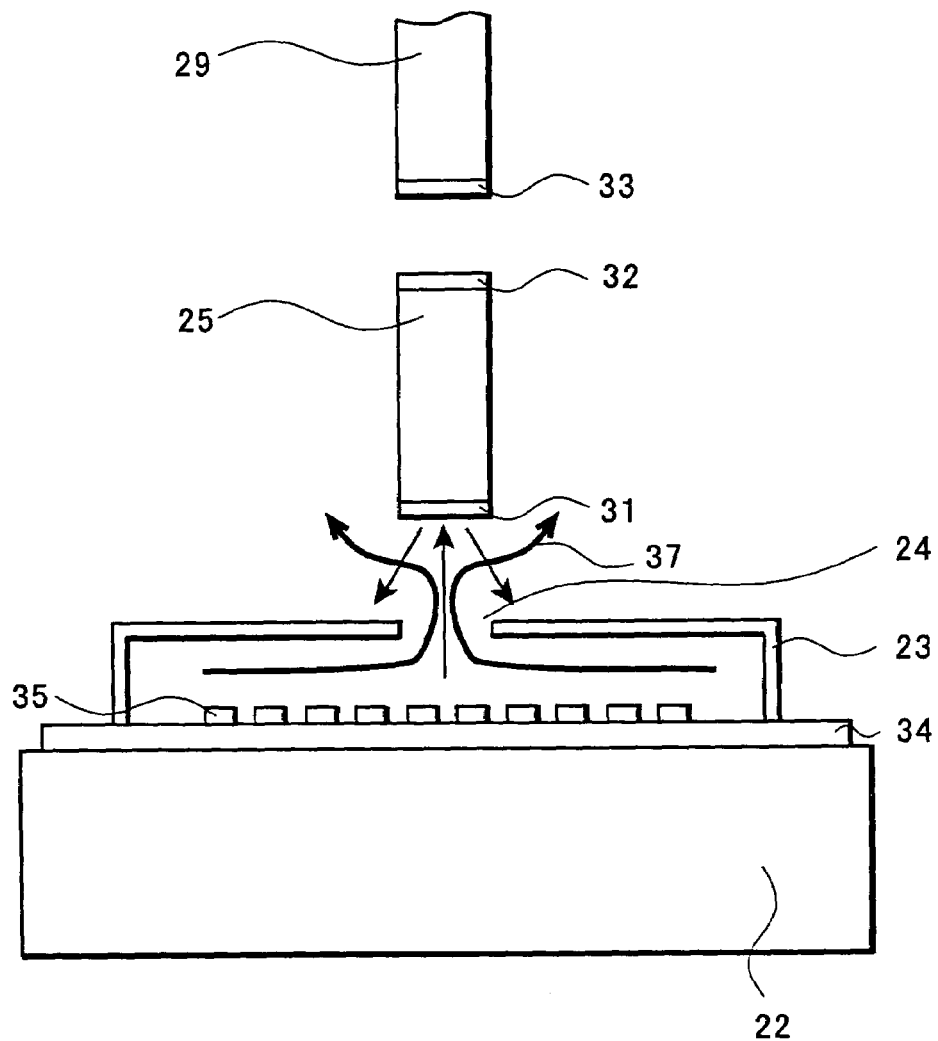
FIG. 3 is a diagram, which shows the bonding device provided with recognition device of the first embodiment of this invention in a simplified manner for explanation.

However, with the present invention, shielding lids 31, 32, and 33 are disposed at the upper and lower ends of ring illumination 25 and the lower end of lens barrel 29 as shown in FIG. 3. The shimmer 37 between ring illumination 25 and working hole 24 can thus be prevented from entering into the inner side of ring illumination 25, especially by shielding lid 31 at the lower end of ring illumination 25. Meanwhile, the shielding lid 32 at the upper end of ring illumination 25 and shielding lid 33 at the lower end of lens barrel 29 prevent the entry of shimmer 37 into the inner side of ring illumination 25 and lens barrel 29 and can also prevent the falling of dusts, etc., from inside lens barrel 29 onto ring illumination 25 and the accumulation of dusts inside ring illumination 25. As a result, with this invention's bonding device 21 provided with recognition device, nitrogen gas can be filled throughout the wire bonding process to prevent oxidation even when a lead frame is set on the setting base over a long period of time.

Furthermore, since the shimmer 37, which is caused by the temperature difference with room temperature when the nitrogen gas that has been heated inside the cover flows to the exterior via working hole 24, can be prevented from entering into the inner side of ring illumination 25 by shielding lids 31, 32, and 33, even if shimmer 37 occurs in the surroundings of ring illumination 25, pattern recognition can be carried out at a high precision of up to the μm order by the recognition camera and wire bonding can thus be carried out at high precision as well.

Furthermore, since by disposing shielding lids 31, 32, and 33 at the upper and lower ends of ring illumination 25 and the lower end of lens barrel 29, the accumulation of dusts, etc., on shielding lid 31 at the lower end of ring illumination 25 can be prevented, pattern recognition by the recognition camera and wire bonding can be performed at high precision.

Furthermore, though when the lead frame 34 surface becomes oxidized, an antioxidant film that can accommodate for temperatures up to 150° C., for example, can become peeled and make the adhesiveness with resin poor, this problem can also be resolved. The bonding device will thus be one by which anti-moisture property and anti-peeling property can also be improved.

Though the case where shielding lids 31, 32, and 33 are disposed at the upper and lower ends of ring illumination 25 and the lower end of lens barrel 29 was described with the present embodiment, this invention is not limited thereto and the abovementioned effects can be obtained by at least disposing shielding lid 31 at the lower end of ring illumination 25.

Also though not illustrated, a cylindrical blowing device, for example, is disposed at a position slightly separated from ring illumination 25 and lens barrel 29 and the entry of shimmer 37 into lens barrel 29 can be prevented by the blow from this blowing device.

Lastly, bonding arm 26, capillary 27, and torch 28 shall be described. As shown in FIG. 2, after pattern recognition, ring illumination 25, bonding arm 26, and capillary 27 move and capillary 27 is positioned above working hole 24. Wire bonding is then performed based on the data obtained by the recognition camera, and capillary 27 enters into cover 23 from working hole 24 to perform wire bonding of the electrode pads of semiconductor elements to the desired electrode patterns. In this process, torch 28 performs stitch bonding and forms a ball at the tip of a thin metal wire that has been cut.

Though wire bonding was described in detail with the present embodiment, equivalent effects can also be provided in die bonding, etc., using an optical recognition device. Also, the object set on the setting base is not limited to a lead frame, and equivalent effects can be obtained for any object with which the oxidation of conductive foil, etc., which shall be described below, needs to be prevented. Applications to devices that are provided with optical recognition devices and are used for the die bonding, wire bonding, or partial coating of soldered parts of metal substrates, printed substrates, ceramic substrates, etc., are also possible.

The circuit device manufacturing method of this invention shall now be described with reference to FIGS. 7 to 16.

Figure 7A:
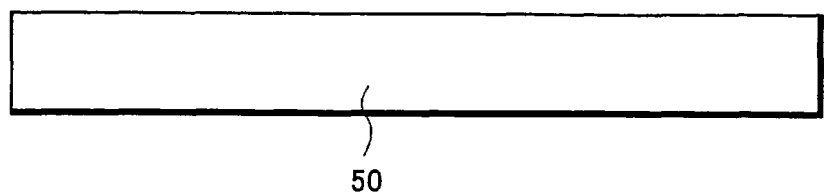
FIG. 7 is a diagram for explaining circuit device manufacturing method of the first and second embodiments of this invention.
Figure 7B:
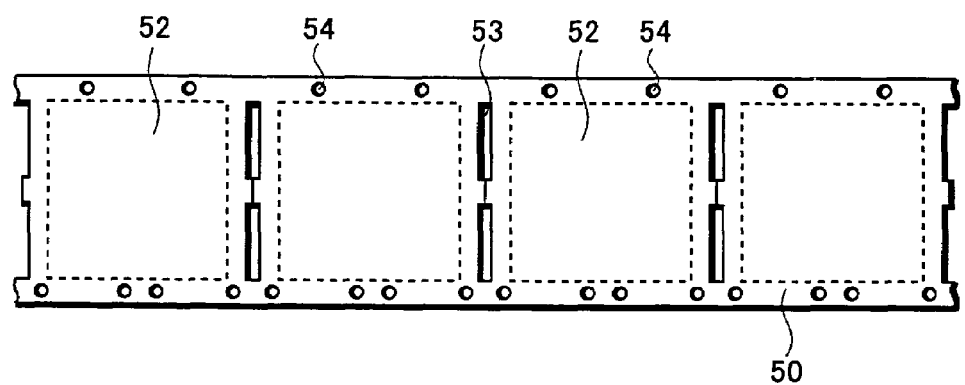
Figure 8:
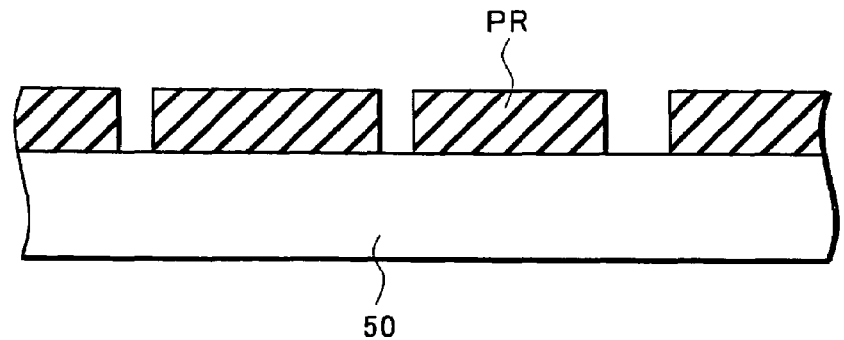
FIG. 8 is a diagram for explaining circuit device manufacturing method of the first and second embodiments of this invention.

First, as shown in FIGS. 7 to 9, in the first step of this invention, a conductive foil 50 is prepared and conductive patterns 41, which comprise at least a plurality of mounting parts for circuit elements 42, are formed by forming isolation trenches 51, each of which is shallower than the thickness of conductive foil 50, by etching conductive foil 50 in regions besides regions of conductive patterns 41.

In this process, first, as shown in FIG. 7(A), a sheet-form conductive foil 50 is prepared. The material of this conductive foil 50 is selected in consideration of the attachment of the soldering material, bonding properties, and plating properties, and in terms of material, a conductive foil having Cu as the main material, a conductive foil having Al as the main material, or a conductive foil comprising an alloy, such as Fe—Ni, etc., is employed.

In consideration of subsequent etching, the thickness of the conductive foil is preferably approximately 10 µm to 300 µm, and with the present embodiment a 70 µm (2 ounce) copper foil was employed. However basically, a foil with a thickness of 300 µm or more or 10 µm or less may also be used. As shall be described later, it is sufficient that isolation trenches 51, which are shallower than the thickness of conductive foil 50, can be formed.

The sheet-form conductive foil 50 that is prepared may be wound in the form of a roll of a predetermined width, for example, 45 mm and this may be conveyed to the respective processes to be described below, or strip-form conductive foils 50, which have been cut to predetermined sizes, may be prepared and conveyed to the respective processes to be described below.

To be more specific, as shown in FIG. 7(B), a plurality (4 to 5 in the present case) of blocks 52, on each of which a plurality of mounting parts are to be formed, are aligned in a separated manner along a strip-form conductive foil 50. Slits 53 are provided between the respective blocks 52 for absorption of the stress placed on conductive foil 50 as a result of heat treatment in the molding process, etc. Furthermore, index holes 54 are provided at fixed intervals at both sides of conductive foil 50 for the purpose of positioning in the respective processes.

Subsequently, conductive patterns are formed.

A photoresist (anti-etching mask) PR is formed on Cu foil 50 as shown in FIG. 8 and photoresist PR is patterned so that conductive foil 50 will be exposed at regions besides regions that are to become conductive patterns 41. Conductive foil 50 is then etched selectively via photoresist PR as shown in FIG. 9(A).

Figure 9A:
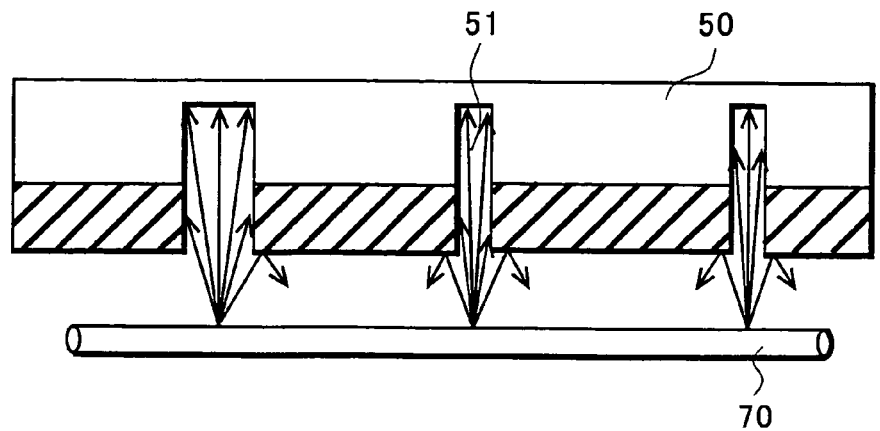
FIG. 9 is a diagram for explaining circuit device manufacturing method of the first and second embodiments of this invention.

In this process, in order to etch and thereby form isolation trenches 51 uniformly and at high precision in terms of depth, the open parts of isolation trenches 51 are faced downwards and etching solution is showered upwards from etching solution supply pipe 70 disposed below conductive foil 50 as shown in FIG. 9(A). As a result, since the portions of isolation trenches 51 that come in contact with the etching solution become etched and the etching solution is discharged immediately without staying inside the isolation trenches 51, the depth of isolation trenches 51 can be controlled by the duration of etching treatment and isolation trenches 51 that are uniform and high in precision can be formed. Ferric chloride or cupric chloride is mainly employed in the etching solution.

Figure 9B:
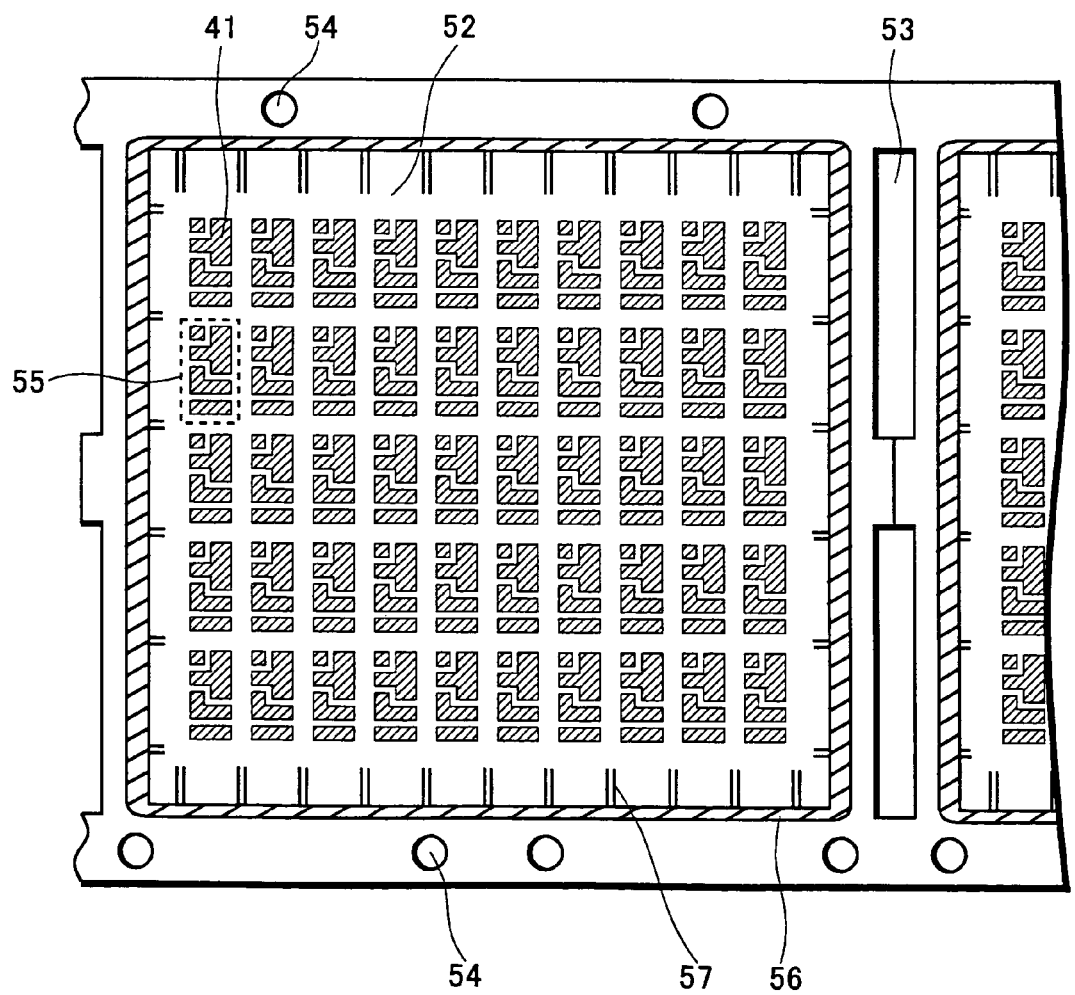

FIG. 9(B) shows specific conductive patterns 41. This Figure corresponds to being an enlarged view of one of the blocks 52 shown in FIG. 7(B). The part indicated by the dotted lines is a single mounting part 55 that makes up conductive patterns 41, a plurality of mounting parts 55 are aligned in matrix form in 10 rows and 5 columns in a single block 52, and the same conductive patterns 41 are provided in each mounting part 55. A frame-like pattern 56 is provided at the periphery of each block and positioning marks 57 for the dicing process are provided slightly separated from and to the inner side of frame-like pattern 56. The frame-like pattern 56 is used for fitting with a molding die and after etching of the rear face of conductive foil 50, serves the function of reinforcing an insulating resin 40.

Figure 10A:
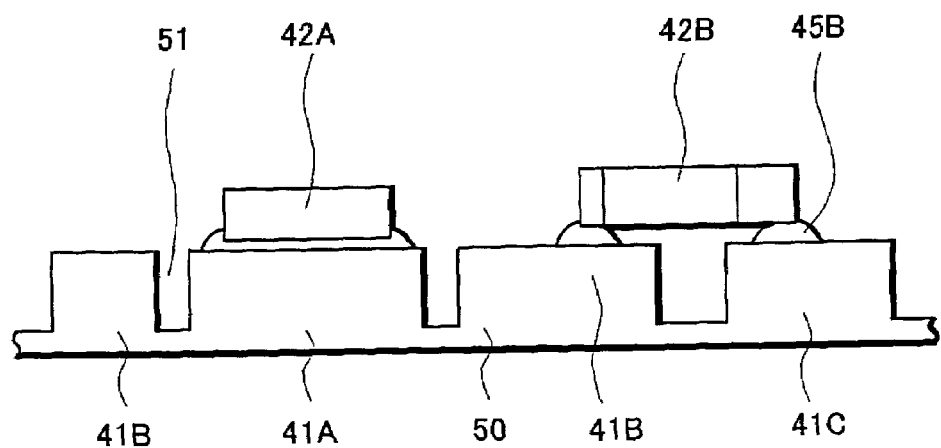
FIG. 10 is a diagram for explaining circuit device manufacturing method of the first and second embodiments of this invention.
Figure 10B:
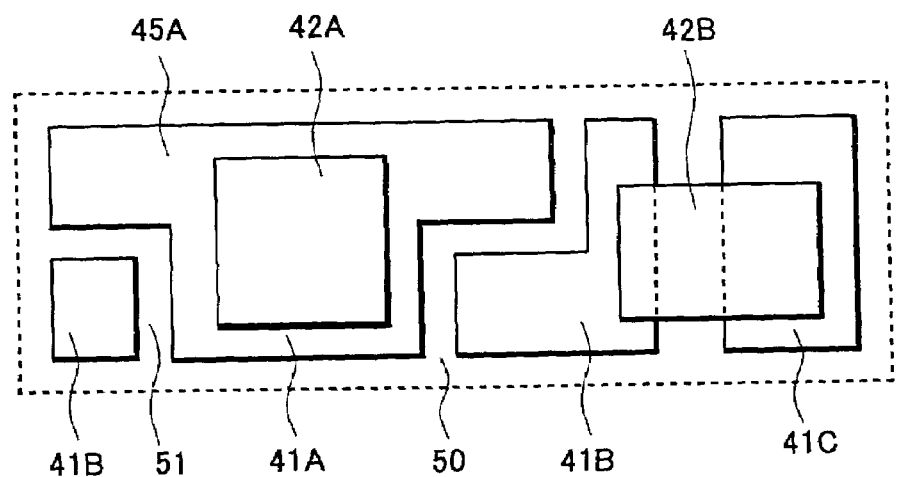

Next in the second step of this invention, circuit elements 42 are affixed to the respective mounting parts 55 with the desired conductive patterns 41 as shown in FIG. 10.

Examples of circuit elements 42 include transistors, diodes, IC chips and other semiconductor elements and chip capacitors, chip resistors, and other passive elements.

Here, a bare transistor chip 42A is die bonded to a conductive pattern 41A and a chip capacitor or passive element 42B is affixed by solder or other soldering material or conductive paste 45B.

Figure 11A:
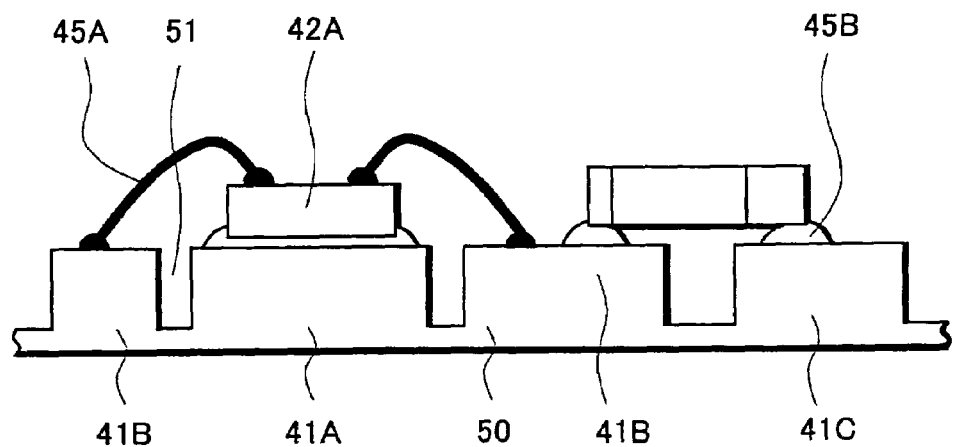
FIG. 11 is a diagram for explaining circuit device manufacturing method of the first and second embodiments of this invention.
Figure 11B:
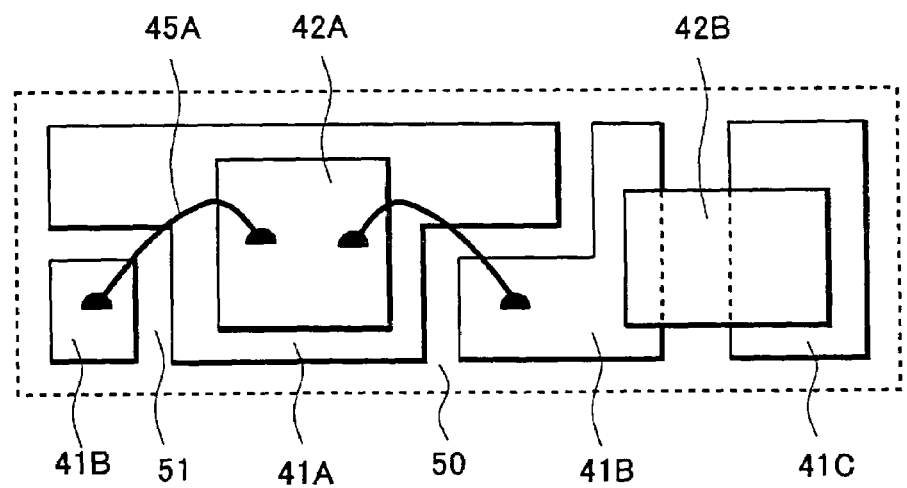

Next, in the third step, which characterizes this invention's circuit device, electrodes of circuit elements 42 of the respective mounting parts 55 are wire bonded to the desired conductive patterns 41 as shown in FIGS. 11 and 12.

Figure 12A:
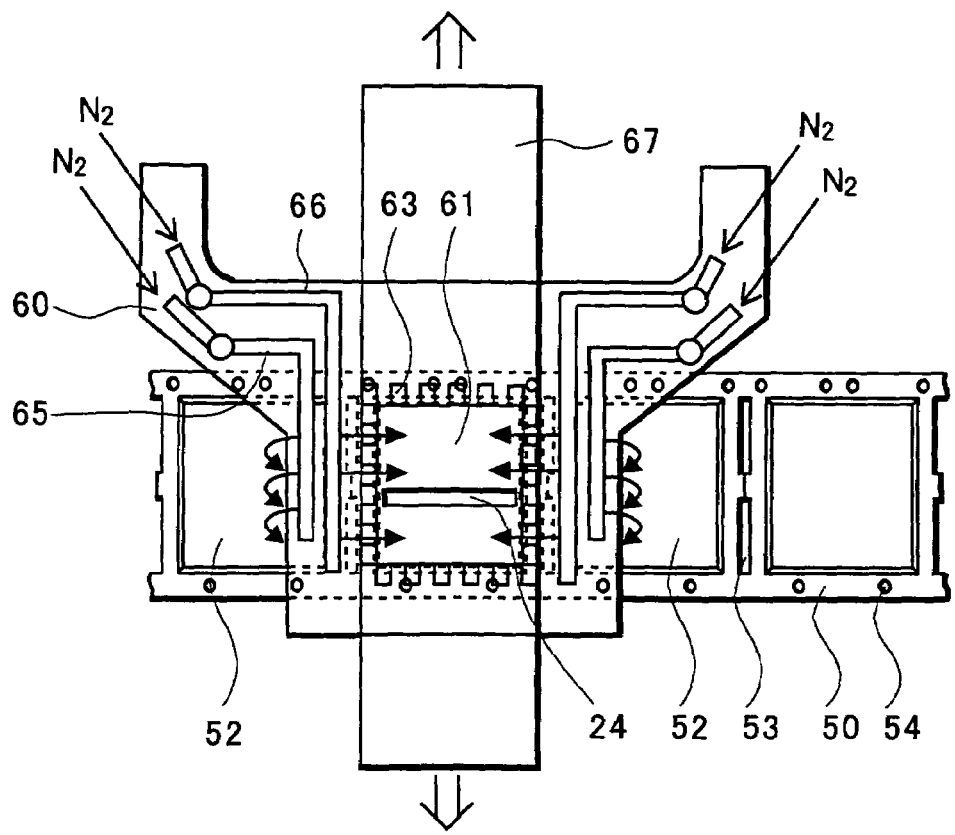
FIG. 12 is a diagram for explaining circuit device manufacturing method of the first and second embodiments of this invention.

In this step, wire bonding is performed using the bonding device 21 provided with recognition device that was shown in FIG. 1. As shown in FIG. 12(A), damper 60 is disposed above setting base 22 of bonding device 21 and the peripheral edges of block 52 of conductive foil 50 are pressed by means of damper 60 to bring conductive foil 50 into close contact with a heating block 64 on the surface of setting base 22.

Pattern recognition of conductive foil 50, fixed on heating block 64, is then performed via working hole 24 and by means of the recognition camera inside lens barrel 29. After pattern recognition, thermocompression ball bonding and ultrasonic wedge bonding of the emitter electrodes of the respective mounting parts 55 inside block 52 to conductive pattern 41B and the base electrodes to conductive pattern 41B are performed as shown in FIG. 11.

Here, as shown in FIG. 12(A), damper 60 has an opening 61 of substantially the same size as block 52 and is provided with protruding and recessed parts 63 at parts that contact conductive foil 50. By holding down the peripheral edges of block 52 by means of protruding and recessed parts 63, the rear surface of block 52 is put into close contact with heating block 64. The interior of damper 60 is provided with paths 65 and 66 for the flow of nitrogen gas.

Figure 12B:
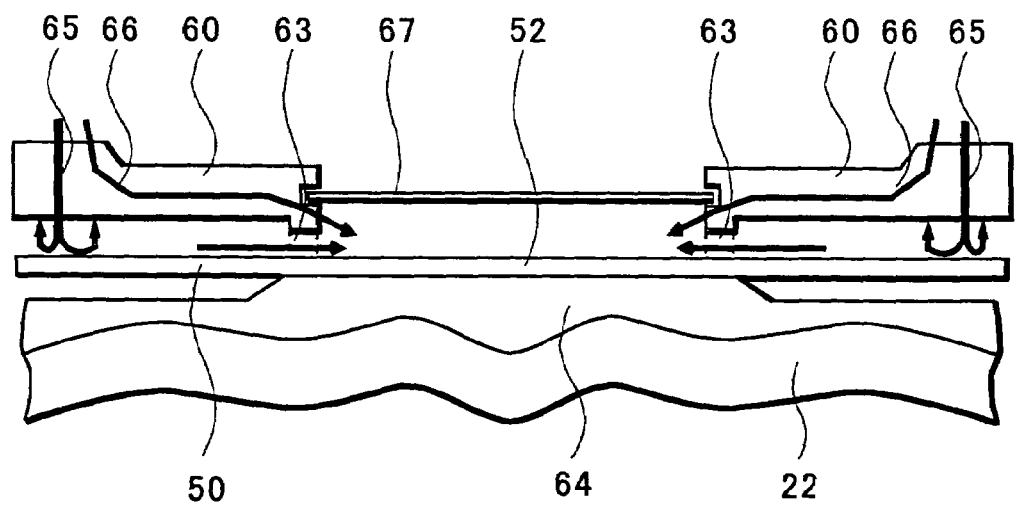

As shown in FIG. 12(B), cover 23 is formed of a damper and a stainless steel plate 67. This plate 67 is fitted inside recessed parts 68 at the upper part of the clamper 60 and is free to move in a direction that is horizontal with respect to the surface of damper 60 and perpendicular to the direction to the direction of movement of conductive foil 50. Working hole 24 is formed in plate 67, and pattern recognition and wire bonding are performed on block 52 by this working hole 24 moving in correspondence to the mounting parts in the row direction on copper foil 50.

Since a plurality of mounting parts 55 exist within block 52 and wire bonding is performed in a batch according to each block 52 in the present step, the duration for which block 52 is heated will be longer in comparison to that of the prior-art circuit device manufacturing method, and oxidation of block 52 may thus occur. In order to resolve this problem, damper 60 is provided as a part of cover 23 of bonding device 21, nitrogen gas is blown onto the surface of block 52 from damper 60, and, at the same time, the interior of cover 23 is filled with nitrogen gas.

Meanwhile, the interior of cover 23 is maintained for example at 230° C. by the function of heater 30 that is built into setting base 22, and the blown-in nitrogen gas is blown in, for example, at a temperature of 70° C. The nitrogen gas is then heated to 230° C. inside cover 23 by heater 30. The nitrogen gas is blown into cover 23 for example at a rate of 4 liters/minute and flows out from working hole 24 upon being heated. Since the temperature of the nitrogen gas is 230° C. at this time and since the room temperature is, for example, 20° C., a shimmer 37 that flows out from working hole 24 is formed by this temperature difference. And by the outflowing shimmer 37 stagnating at the inner side of ring illumination 25 and fluctuating in the process of passing through the inner side of ring illumination 25 as shown in FIG. 3, the pattern recognition precision degrades.

However, with this invention's bonding device 21, shielding lids 31, 32, and 33 are disposed at the upper and lower parts of ring illumination 25 and at lens barrel 29. Shimmer 37 can thus be prevented from entering into the inner side of ring illumination 25, especially by shielding lid 31 at the lower part of ring illumination 25. Since the illumination inside ring illumination 25 is thus prevented from fluctuating due to shimmer 37, pattern recognition by the recognition camera can be performed at a high precision of the μm order and wire bonding can also be performed at high precision. As a result, a circuit device manufacturing method can be realized by which high precision wire bonding can be performed even on small-area integrated type conductive patterns such as those of cluster block 52.

Furthermore by the resolving of the problem of the nitrogen gas for prevention of oxidation of the conductive foil 50 surface as described above, nitrogen gas can be used throughout the wire bonding process. Since the surface of conductive foil 50 will thus not become oxidized, for example, the degradation of adhesiveness with resin, due to the antioxidant film, which can accommodate temperatures up to 150° C., peeling as a result of oxidation of the conductive foil 50 surface, can be prevented. As a result, a circuit device manufacturing method can be realized by which the anti-moisture property and anti-peeling property at the surfaces of bonding of conductive foil 50 and insulating resin 40 are improved.

Figure 13A:
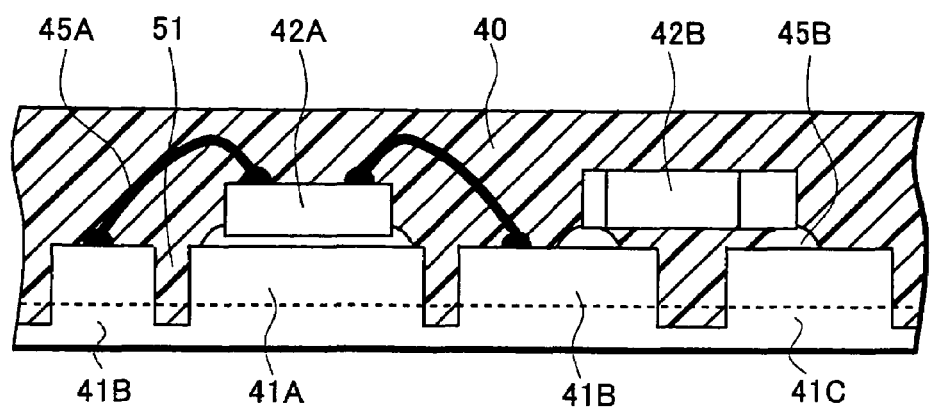
FIG. 13 is a diagram for explaining circuit device manufacturing method of the first and second embodiments of this invention.
Figure 13B:
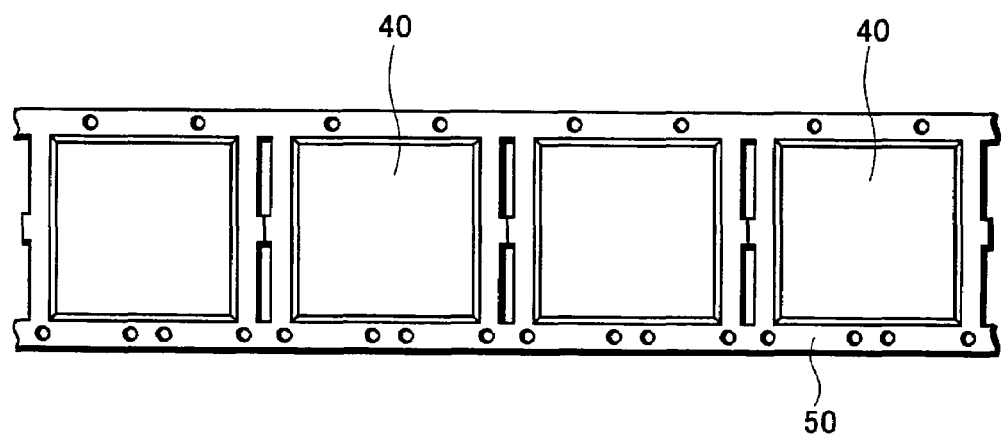

Next in the fourth step of this invention, molding in common by insulating resin 40 is performed so as to cover the circuit elements 42 of the respective mounting parts 55 in a batch and fill the isolation trenches 51 as shown in FIG. 13.

In this process, insulating resin 40 is made to cover circuit elements 42A and 42B and the plurality of conductive patterns 41A, 41B, and 41C completely and insulating resin 40 is filled in the isolation trenches 51 between conductive patterns 41 so as to fit and bind strongly with the bent structures at the side faces of conductive patterns 41A, 41B, and 41C as shown in FIG. 13(A). Conductive patterns 41 are thus supported by insulating resin 40.

This step may also be realized by transfer molding, injection molding, or potting. In terms of resin material, a thermosetting resin, such as epoxy resin, etc., may be used for transfer molding, and a thermoplastic resin, such as polyimide resin, polyphenylene sulfide, etc., may be used for injection molding.

The thickness of insulating resin 40 that is made to cover the conductive foil 50 surface is adjusted so that uppermost part of a bonding wire 45A of a circuit element 42 will be covered by approximately 100 μm of resin. This thickness can be made thicker or thinner in consideration of strength.

A characteristic of this step is that until insulating resin 40 is coated, the conductive foil 50 that is to become conductive patterns 41 is the supporting substrate and the conductive foil 50 that is to be the supporting substrate is a material that is necessary as an electrode material. The merit that work can be performed by eliminating as much component material as possible is thus provided and cost reductions can also be realized.

Since isolation trenches 51 are formed to be shallower than the thickness of the conductive foil 50, conductive foil 50 is not separated into individual conductive patterns 41. The sheet-form conductive foil 50 can thus be handled in one piece, thus providing the characteristic that the work of conveying to a die and the work of constituting to a die in the process of molding insulating-resin 40 are made extremely easy.

Figure 14:
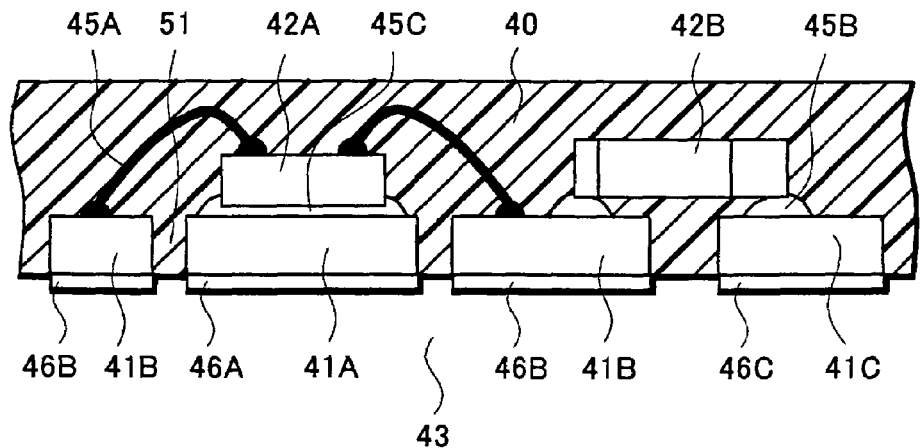
FIG. 14 is a diagram for explaining circuit device manufacturing method of the first and second embodiments of this invention.

In the fifth step of this invention, the conductive foil 50 at thick parts at which isolation trenches 51 are not provided is eliminated as shown in FIG. 14.

In this step, the rear surface of conductive foil 50 is removed chemically and/or physically to separate the respective conductive patterns 41. This step is carried out by polishing, grinding, etching, vaporization of metal by laser, etc.

In experiments, the entire surface was ground by approximately 30 μm by a polishing device or grinding device to expose insulating resin 40 via isolation trenches 51. The exposed surface is indicated by a dotted line in FIG. 13(A). As a result, conductive patterns 41 are made approximately 40 μm in thickness and separated. Also, the entire surface of conductive foil 50 may be wet etched until immediately before insulating resin 40 becomes exposed and the entire surface may then be ground by a polishing or grinding device to expose insulating resin 40. Furthermore, the entire surface of conductive foil 50 may be wet etched to the position indicated by the dotted line in order to expose insulating resin 40.

As a result, a structure is provided with which the rear faces of conductive patterns 41 are exposed on insulating resin 40. The structure is thus one with which the surface of insulating resin 40 that has been filled in isolation trenches 51 is practically matched with the surfaces of conductive patterns 41. The circuit devices 42 of this invention thus have the characteristic that they can be moved horizontally as they are by the surface tension of solder, etc., and become self-aligned in the mounting process.

Rear surface treatment of conductive patterns 41 is furthermore performed to obtain the final structure shown in FIG. 14. That is, solder or other conductive material is deposited onto the exposed conductive patterns 41 as necessary in order to complete the circuit device.

Figure 15:
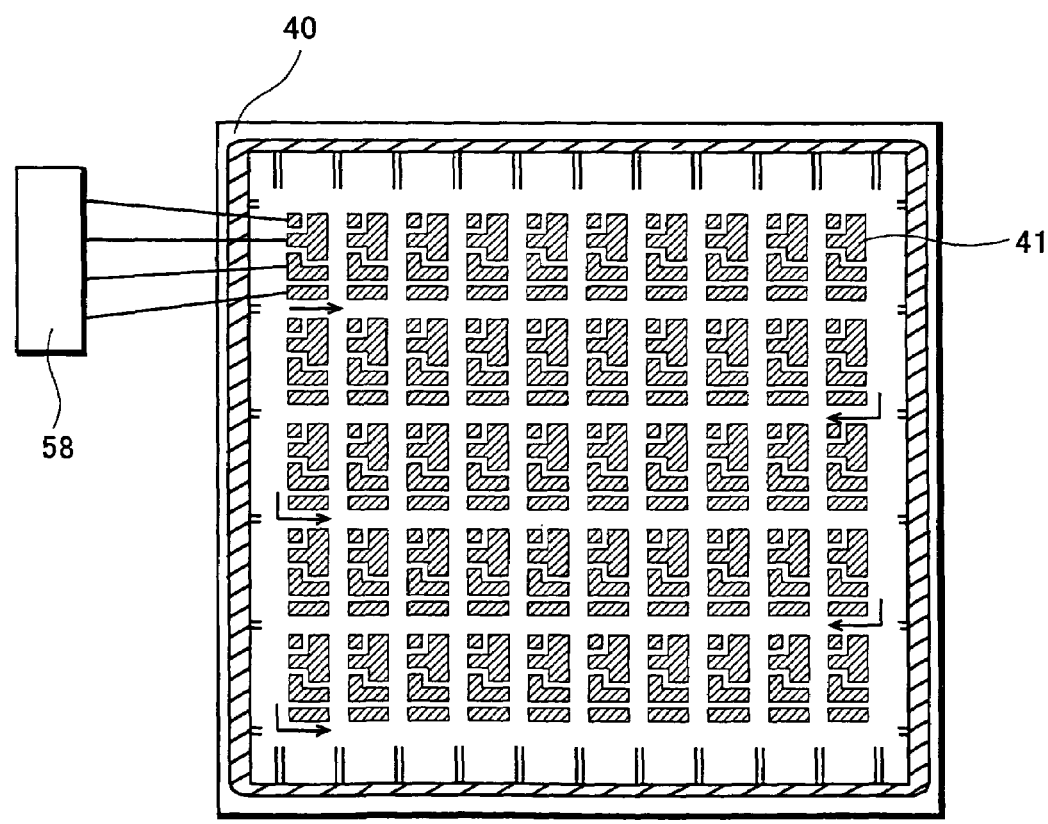
FIG. 15 is a diagram for explaining circuit device manufacturing method of the first and second embodiments of this invention.

In the sixth step of this invention, the characteristics of the circuit elements 42 of the respective mounting parts 55 that have been molded in a batch with insulating resin 40 are measured as shown in FIG. 15.

After performing rear surface etching of conductive foil 50 in the prior process, the respective blocks 52 are cut off from conductive foil 50. Since each block 52 is joined by insulating resin 40 to the remaining parts of conductive foil 50, it can be cut off by peeling from the remaining parts of conductive foil 50 mechanically and without using a cutting die.

As shown in FIG. 15, the rear surfaces of conductive patterns 41 are exposed at the rear surface of each block 52 and the respective mounting parts 55 are aligned in matrix form in exactly the same manner as they were when conductive patterns 41 were formed. By contacting rear surface electrodes 46, which are exposed from insulating resin 40 of conductive patterns 41, with a probe 58, the characteristic parameters, etc., of the circuit elements 42 of the respective mounting parts 55 are measured individually to make pass/fail judgements, and defective items are marked with magnetic ink, etc.

In this process, circuit devices 43 of the respective mounting parts 55 are held integrally according to block 52 by insulating resin 40 and are thus not separated individually. Thus by pitch feeding a block 52 placed on a setting base of a tester by just the size of a mounting part 55 in the longitudinal and horizontal directions as indicated by the arrows, the circuit devices 43 of the respective mounting parts 55 of block 52 can be measured extremely rapidly and in large amounts. That is, since the judgement between the front and rear of a circuit device, recognition of the position of electrodes, etc., which were necessary priorly, can be made unnecessary, considerable reduction of the measurement time can be achieved.

Figure 16:
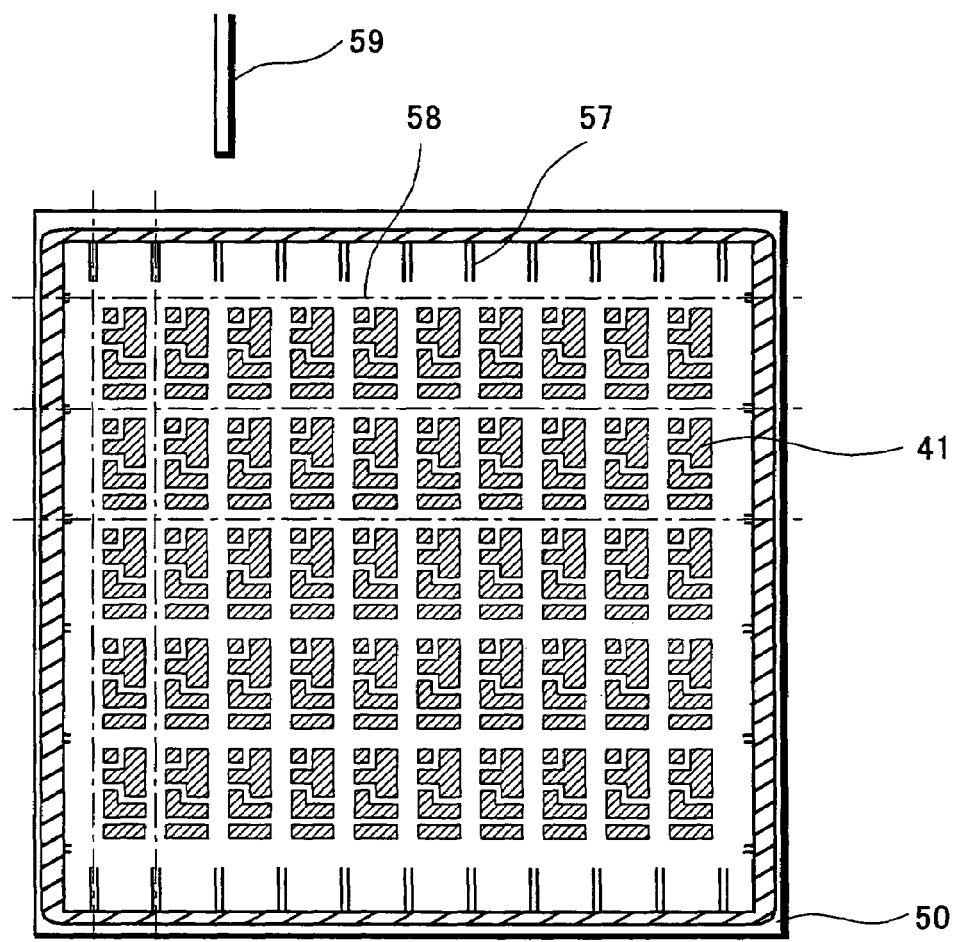
FIG. 16 is a diagram for explaining circuit device manufacturing method of the first and second embodiments of this invention.
Figure 17:
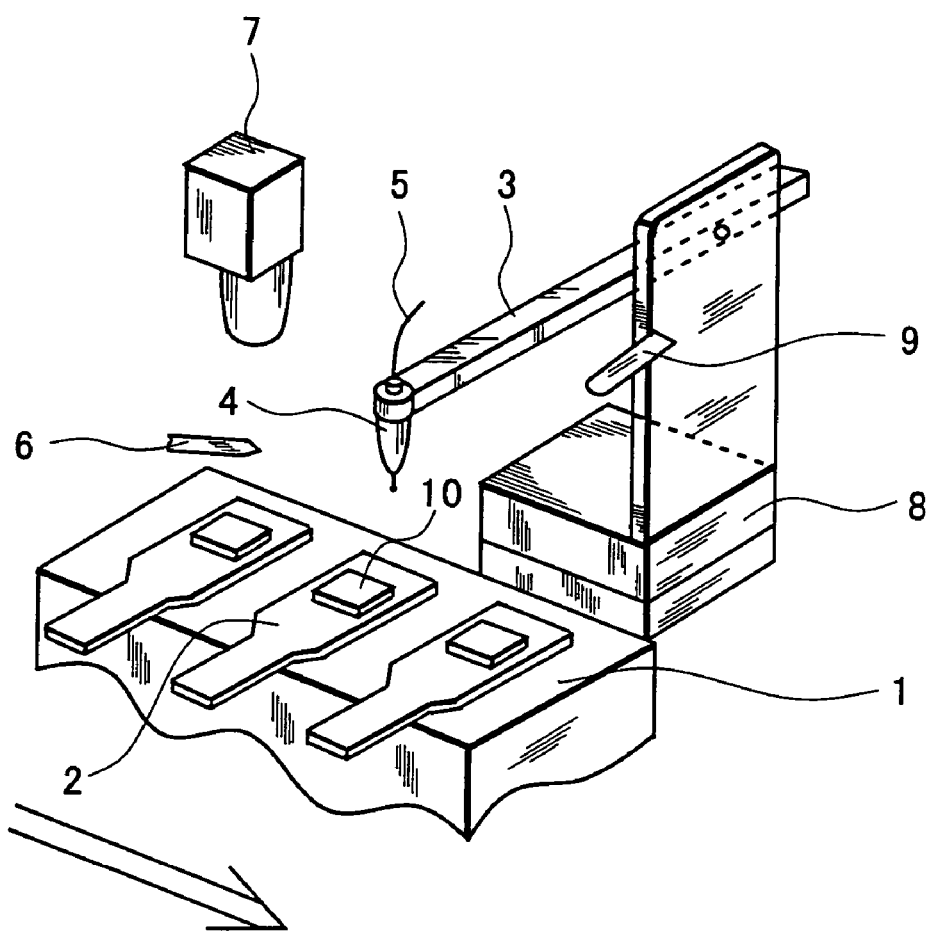
FIG. 17 is a diagram for explaining a bonding device provided with recognition device of the prior art.

Next in the seventh step of this invention, insulating resin 40 is separated according to each mounting part 55 by dicing as shown in FIG. 16.

In this step, dicing blade 59 is preferably operated to a cutting depth at which insulating resin 40 is substantially severed and breaking by a roller is performed after taking out block 52 from the dicing device. In the dicing process, the positioning marks 57, which were provided in advance in the above-described first step in a manner whereby they oppose each other at the inner sides of the frame-like pattern 56 that surrounds each block, are recognized and dicing is performed using these marks as reference. Though it is well known, for dicing, dicing in the longitudinal direction is performed along all dicing lines 58 and then the setting base is rotated by 90 degrees to perform dicing in the horizontal direction along dicing lines 58.

Circuit devices 43 are thus completed by the above-described manufacturing process.

Though the case where cluster blocks are formed on a conductive foil was described for this invention's circuit device manufacturing method, this invention is not necessarily limited to this case and the same effects can be obtained for substrates comprising conductive members, such as lead frames, etc. Also, this invention is not limited to a circuit device manufacturing method but can provide the same effects in semiconductor device manufacturing methods. Various other modifications are possible within a scope that does not fall outside the gist of this invention.

Next, with regard to the recognition device, bonding device, and circuit device manufacturing method of this invention, a second embodiment shall be described in detail. Since the circuit device manufacturing method for this embodiment is carried out in the same manner as the first embodiment, the first embodiment should be referred to regarding the circuit manufacturing method and descriptions thereof shall be omitted here.

This invention's recognition device and bonding device shall now be described with reference to FIGS. 4 through 6.

With an embodiment of this invention, the recognition device and bonding device act together and are arranged as a bonding device 121 provided with a single recognition device.

Figure 4:
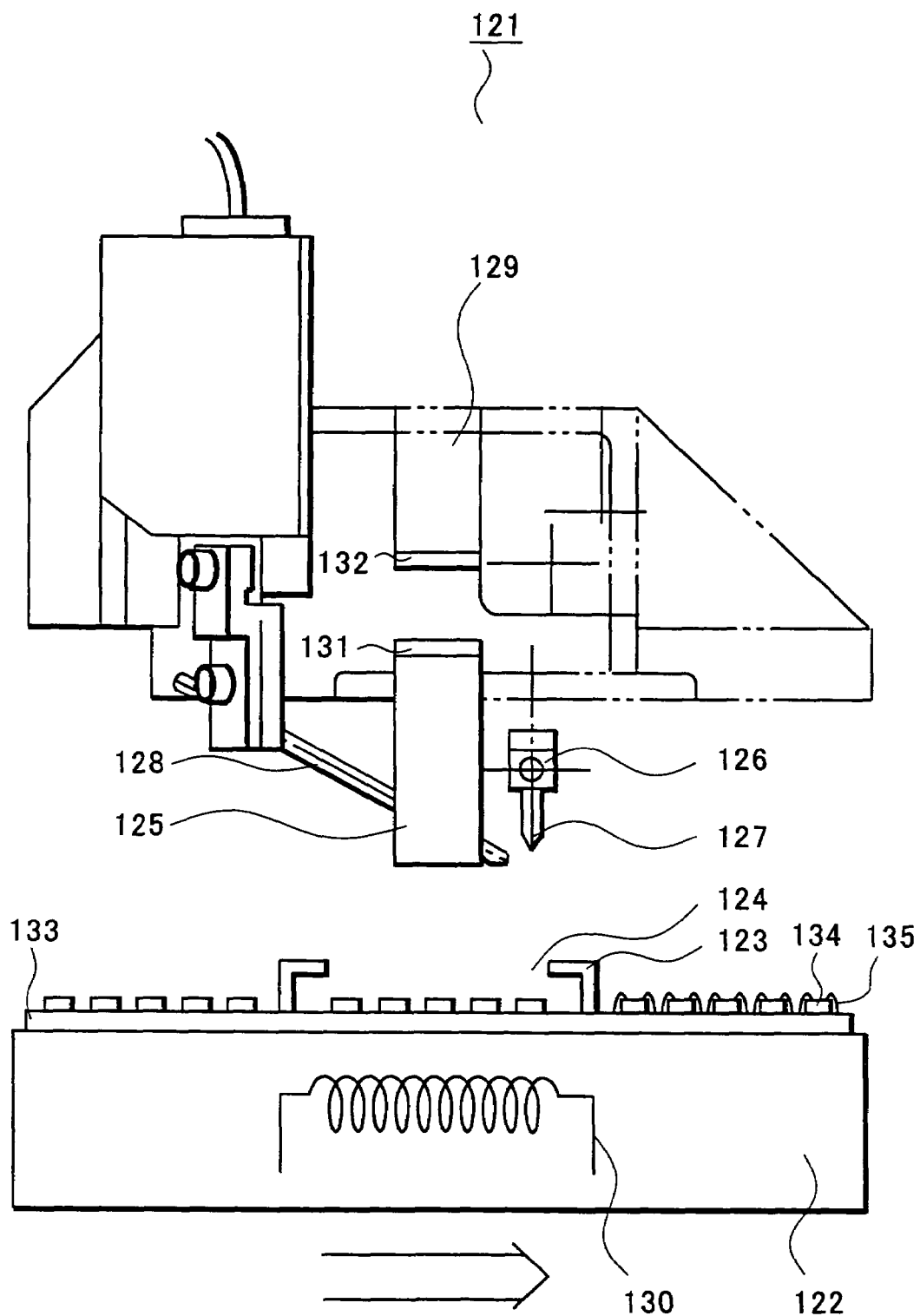
FIG. 4 is a diagram for explaining the bonding device provided with recognition device of the second embodiment of this invention.
Figure 5:
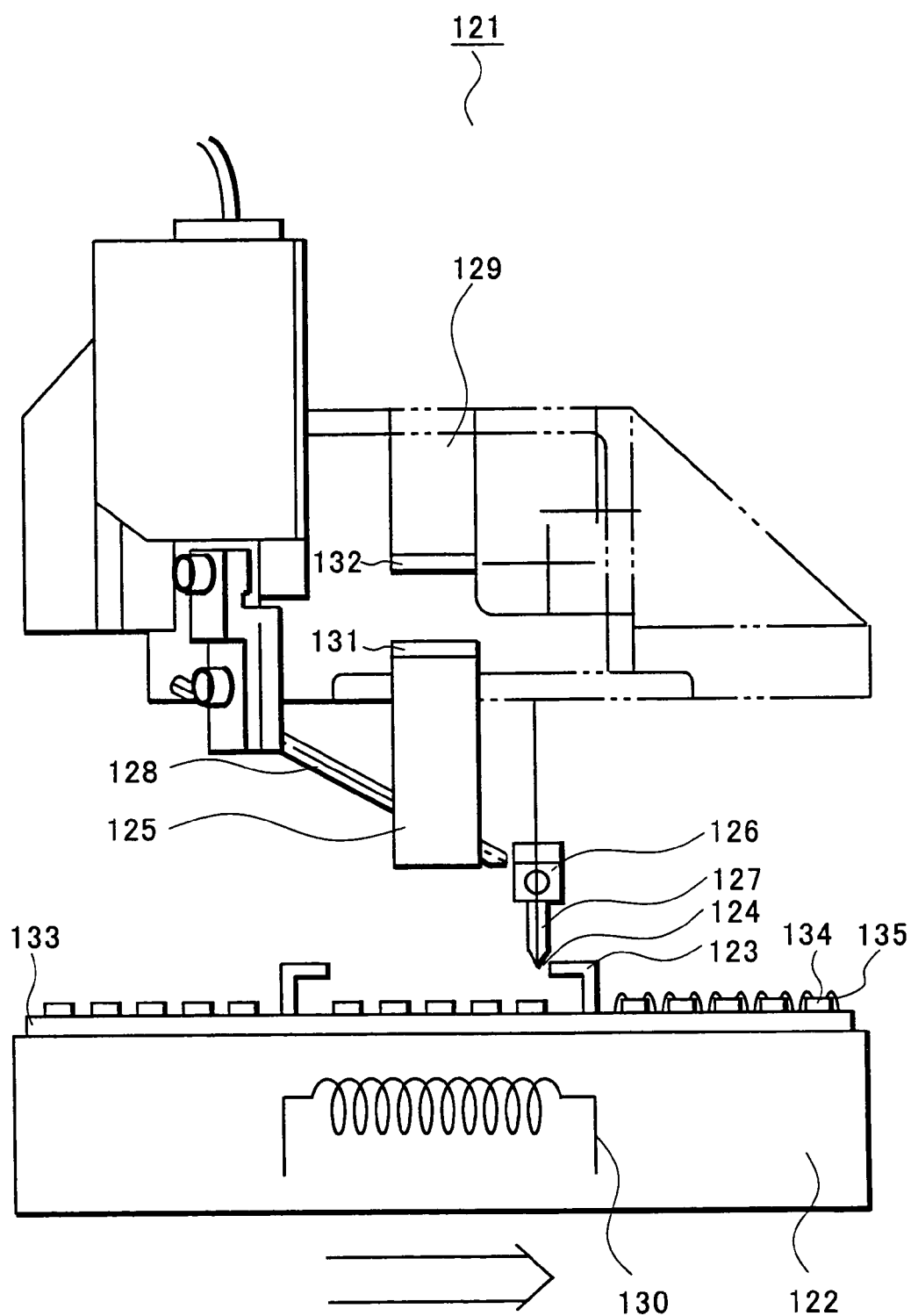
FIG. 5 is a diagram for explaining the bonding device provided with recognition device of the second embodiment of this invention.

As shown in FIG. 4, the main structure of bonding device 121 comprises a setting base 122, a cover 123, which covers a working space from above setting base 122, a working hole 124, which is provided in the upper surface of cover 123, a ring illumination 125, which is disposed above working hole 124, a bonding arm 126, which is disposed at the side face of ring illumination 125, a capillary 127, which is disposed at the tip part of bonding arm 126, a torch 128, which is provided near capillary 127, a lens barrel 129, which is disposed above ring illumination 125, and a recognition camera, which, though not illustrated, is installed inside lens barrel 129.

The characteristics of the individual structures shall now be described along with their operations.

First, on setting base 122 is set a lead frame 133, which has a plurality of mounting parts, and setting base 122 is provided with a heater 130 function for heating lead frame 133 and thereby improving the wire bonding property. By means of this heater 130, the interior of a working space arranged by setting base 122 and cover 123, can be kept at a high temperature state of, for example, approximately 230° C. during the wire bonding process.

Also, though not shown in FIG. 4, a part of cover 123 is formed of a damper 60 (see FIG. 12), and this cover 123 is arranged by putting a lid on the upper face of damper 60 for example by means of a stainless steel plate 67 (see FIG. 12). And, for example, nitrogen gas is blown as an inert gas at a rate of 4 liters/minute into cover 123 from damper 60. This blow-in rate can be varied according to the working application. Working hole 124 is provided in the upper surface of cover 123. Working hole 124 is formed to a size, for example, of 5 mm×32 mm and pattern recognition and wire bonding are performed via this working hole 124 in the wire bonding process.

Here, on lead frame 133, for example 10 rows and 5 columns of mounting parts make up a single cluster block, and a plurality of such cluster blocks are formed. The size of working hole 124 is such that enables, for example, 20 mounting parts of 2 rows of a single cluster block to be recognized from above. As shall be described later, this working hole 124 is used for pattern recognition, etc. The size of this working hole 124 is not defined in particular but is determined according to the working application and based on the recognition pattern method, etc., of bonding device 121.

Since ring illumination 125 and lens barrel 129 are the same as those of the first embodiment, the first embodiment should be referred to regarding these components and descriptions thereof shall be omitted here.

With bonding device 121 provided with recognition device that characterizes this invention, shielding lids 131 and 132 are disposed at the upper end of the above-described ring illumination 125 and the lower end of lens barrel 129. Each of these shielding lids 131 and 132 comprises a transparent film or transparent glass plate etc., and do not obstruct pattern recognition even when disposed at the upper end of ring illumination 125 and the lower end of lens barrel 129.

The action of shielding lids 131 and 132 is mainly to prevent shimmer 136, which results from the temperature difference with respect to room temperature of the nitrogen gas that flows out from working hole 124, from entering into the inner side of ring illumination 125 and lens barrel 129. Shimmer 136 occurs due to the following work. First, nitrogen gas is for example blown at a rate of 4 liters/minute inside cover 123. At the same time, the interior of cover is kept at a temperature for example of 230 degree. C. by heater 130 built into setting base 122. Though the nitrogen gas that is fed in thereafter is, for example, at 70 degree. C., it is heated to 230 degree. C. by the heat from heater 130.

Though the heated nitrogen gas flows out to the exterior from working hole 124, since the room temperature at this time, is for example, 20° C., shimmer 136, which is substantially that of the nitrogen gas, is caused by the temperature difference between the nitrogen gas and room temperature. As a result, in the case where shielding lids 131 and 132 are not used, shimmer 136 stagnates at the inner side of ring illumination 125 and furthermore fluctuates in the process of passing through the inner side of ring illumination 125, causing the recognition precision of the recognition camera to degrade and the wire bonding precision to fall.

Figure 6:
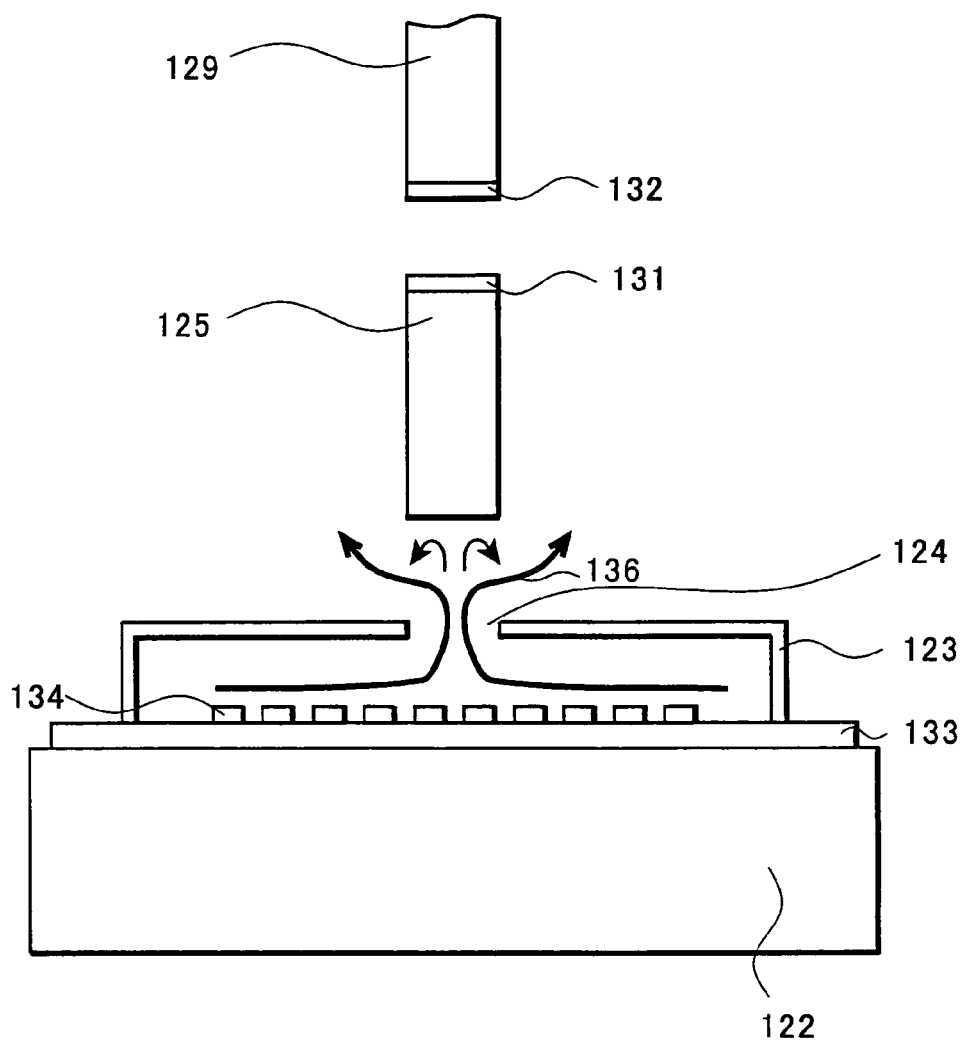
FIG. 6 is a diagram, which shows the bonding device provided with recognition device of the second embodiment of this invention in a simplified manner for explanation.

However, with the present invention, shielding lids 131 and 132 are disposed at the upper end of ring illumination 125 and the lower end of lens barrel 129 as shown in FIG. 6. Thus though the shimmer 136 between ring illumination 125 and working hole 124 will enter into the inner side of ring illumination 125 at first it can be prevented from passing through, especially by shielding lid 131 at the upper end of ring illumination 125. Meanwhile, the shielding lid 132 at the lower end of lens barrel 129 prevents the entry of shimmer 135 into lens barrel 129 and can also prevent the falling of dusts, etc., from inside lens barrel 129 onto ring illumination 125. As a result, with this invention's bonding device 121 provided with recognition device, nitrogen gas can be filled throughout the wire bonding process to prevent oxidation even when a lead frame is set on the setting base over a long period of time.

Furthermore, the shimmer 136, which is caused by the temperature difference with room temperature when the nitrogen gas that has been heated inside cover 123 flows to the exterior via working hole 124, arises in the surroundings of illumination ring 125. Though this shimmer 136 will enter into the inner side of ring illumination 125 at first, when the interior of ring illumination 125 becomes filled with shimmer 136, shimmer 136 is prevented from entering further by shielding lid 131. Continued entry of shimmer 136 into ring illumination 125 and the passage of shimmer 136 through the interior of ring illumination 125 can thus be prevented. Thus even though a shielding lid is not disposed at the lower end of ring illumination 125, the same effects as those obtained in the case where a shielding lid is disposed can be obtained, thereby enabling pattern recognition to be carried out at a high precision of up to the μm order by the recognition camera and wire bonding to be carried out at high precision as well.

Furthermore, though when the lead frame 133 surface becomes oxidized, an antioxidant film that can accommodate for temperatures up to 150° C., for example, can become peeled and make the adhesiveness with resin poor, this problem can also be resolved. The bonding device will thus be one by which anti-moisture property and anti-peeling property can also be improved.

Though the case where shielding lids 131 and 132 are disposed at the upper end of ring illumination 125 and the lower end of lens barrel 129 was described with the present embodiment, this invention is not limited thereto and the abovementioned effects can be obtained by at least disposing shielding lid 131 at the upper end of ring illumination 125.

Though with the above-described second embodiment, the case where shielding lid 131 is disposed at the upper end of ring illumination 125 was described, this invention is not necessarily limited to this embodiment. For example, the same effects as the above-described effects can be obtained as long as shielding lid 131 is disposed at any one location between the upper end and the lower end at the inner side of ring illumination 125.

Lastly, since bonding arm 126, capillary 127, and torch 128 are the same as those of the first embodiment, the first embodiment should be referred to regarding these components and descriptions thereof shall be omitted here.

Though wire bonding was described in detail with the present embodiment, equivalent effects can also be provided in die bonding, etc., using an optical recognition device. Also, the object set on the setting base is not limited to a lead frame, and equivalent effects can be obtained for any object with which the oxidation of conductive foil, etc., which shall be described below, needs to be prevented. Applications to devices that are provided with optical recognition devices and are used for the die bonding, wire bonding, or partial coating of soldered parts of metal substrates, printed substrates, ceramic substrates, etc., are also possible.

What is claimed is:

1. A semiconductor device manufacturing method comprising:
preparing an assembling apparatus comprising a cover, having an opening therein, provided on a setting base comprising a heating function and further comprising a means for filling the interior of the cover with an inert gas;

setting a plate-like substrate having conductive patterns mounted on the setting base; and mounting a semiconductor chip to the substrate or wire-bonding electrodes of the semiconductor chip to the conductive patterns through the opening, wherein upon mounting or wire-bonding the semiconductor chip, the inert gas flows to prevent oxidation of the conductive patterns generated by the heating function.

2. The circuit device manufacturing method according to claim 1, wherein the inert gas comprises nitrogen gas.

3. A semiconductor device manufacturing method comprising:

preparing an assembling apparatus comprising a cover, having an opening therein, provided on a setting base comprising a heating function;

setting a plate-like substrate having conductive patterns mounted on the setting base; and mounting a semiconductor chip to the substrate or wire-bonding electrodes of the semiconductor chip to the conductive patterns through the opening, wherein an illumination is disposed above the opening and a transparent shielding means is provided at least at a lower end of the illumination to prevent a fluctuation of the inert gas generated by the heating function from entering the inside of the illumination upon mounting or wire-bonding the semiconductor chip.

4. The semiconductor device manufacturing method of claim 3, wherein the shielding means is provided at any position between an upper end and the lower end of the illumination.

5. The semiconductor device manufacturing method of claim 3, wherein a lens barrel is disposed above the illumination and a pattern recognition camera is provided in the lens barrel.

6. The semiconductor device manufacturing method of claim 5, wherein the shielding means is provided at least at a lower end of the lens barrel.

7. The semiconductor device manufacturing method of any of claims 3, 4, 5 or 6, wherein the shielding means is a shielding lid comprising a transparent film or a transparent plate.

8. The circuit device manufacturing method according to claim 7, wherein the inert gas comprises nitrogen gas.

9. The semiconductor device manufacturing method according to claim 1, wherein the plate-like substrate has a plurality of blocks on each of which a plurality of mounting parts is formed.

10. The semiconductor device manufacturing method according to claim 3, wherein the plate-like substrate has a plurality of blocks on each of which a plurality of mounting parts is formed.

* * * * *